United States Patent
Kuo

(10) Patent No.: US 8,300,476 B2
(45) Date of Patent: *Oct. 30, 2012

(54) METHOD FOR ERASING/PROGRAMMING/CORRECTING MEMORY

(75) Inventor: Ming-Chang Kuo, Lugang Township, Changhua County (TW)

(73) Assignee: Macronix International Co., Ltd., Hsinchu (TW)

( * ) Notice: Subject to any disclaimer, the term of this patent is extended or adjusted under 35 U.S.C. 154(b) by 29 days.

This patent is subject to a terminal disclaimer.

(21) Appl. No.: 12/889,710

(22) Filed: Sep. 24, 2010

(65) Prior Publication Data

US 2011/0013462 A1  Jan. 20, 2011

Related U.S. Application Data

(63) Continuation of application No. 11/942,041, filed on Nov. 19, 2007, now Pat. No. 7,821,838.

(51) Int. Cl.
*G11C 16/04* (2006.01)
(52) U.S. Cl. ......... 365/185.24; 365/185.22; 365/185.18; 365/185.03

(58) Field of Classification Search ............. 365/185.03, 365/185.22, 185.24, 185.18, 185.27
See application file for complete search history.

(56) References Cited

U.S. PATENT DOCUMENTS

| 6,801,456 | B1 | 10/2004 | Hsu et al. | |
| 6,967,873 | B2 | 11/2005 | Hamilton et al. | |
| 7,342,827 | B2* | 3/2008 | Park et al. | 365/185.12 |
| 7,821,838 | B2* | 10/2010 | Kuo | 365/185.24 |

FOREIGN PATENT DOCUMENTS

CN  1864231  11/2006

OTHER PUBLICATIONS

English language translation of abstract of CN 1864231 (published Nov. 15, 2006).

* cited by examiner

*Primary Examiner* — Andrew Q Tran
(74) *Attorney, Agent, or Firm* — Thomas|Kayden

(57) ABSTRACT

A memory operating method includes the following steps. First, a memory with a charge storage structure is provided. Next, the memory is biased to a first threshold voltage. Then, the memory is biased to a second threshold voltage. Next, the memory is biased to a third threshold voltage. The first threshold voltage is higher than a first level. The second threshold voltage is lower than a second level. The third threshold voltage is approximating or equal to the second level.

25 Claims, 7 Drawing Sheets

METHOD FOR ERASING/PROGRAMMING/CORRECTING MEMORY

This application is a continuation application of U.S. application Ser. No. 11/942,041, filed on Nov. 19, 2007, now U.S. Pat. No. 7,821,838, the entirety of which is incorporated herein by reference.

BACKGROUND OF THE INVENTION

1. Field of the Invention

The invention relates in general to a memory operating method, and more particularly to a memory operating method using a multi-level cell (MLC).

2. Description of the Related Art

In the memory manufacturing industry, increasing the density of the memories to reduce the manufacturing cost is the important factor of the technology development. As the size of the memory device is gradually reduced to a micro-size which approximates to the physical limitation, increasing the density of the memory devices has become more and more difficult.

Thus, the concept of designing the memory having a multi-level cell (MLC) has been proposed and becomes another developing direction of increasing the density of the memories. The memory with the MLC distinguishes the bit state stored in the memory using charge carriers to change the threshold level of the memory cell and then reading the value of the current. The current memory programming method cannot program the memory cell to the precise threshold level so that the ranges of the read currents representing different bits tend to overlap and the bit determination becomes difficult.

Thus, it is an important subject in the industry to make the memory cell have the precise threshold level and thus increase the correctness of reading data when the memory cell is being programmed.

SUMMARY OF THE INVENTION

The invention is directed to a memory operating method, which corrects a threshold level in many stages of a programming procedure such that a memory cell can be precisely changed to a predetermined threshold level in each programming operation, the reliability of the memory having a MLC may be enhanced, and the correctness of reading data can be enhanced.

According to the present invention, a memory operating method is provided. The method includes the following steps. First, a memory including a charge storage structure is provided. Next, first type charges are injected into the charge storage structure such that a threshold level of the memory is higher than an erase level. Then, second type charges are injected into the charge storage structure such that the threshold level of the memory is lower than a predetermined bit level. Next, the first type charges are injected into the charge storage structure such that the threshold level of the memory approximates to or is equal to the predetermined bit level.

According to the present invention, a memory operating method is provided. The method includes the following steps. First, a memory is provided. The memory includes a charge storage structure, a substrate and a gate. The substrate has a channel region, a source region and a drain region. The channel region is positioned between the source region and the drain region, the charge storage structure is disposed on the channel region, and the gate is disposed on the charge storage structure. Next, a first gate bias, a first source bias and a first drain bias are applied to the gate, the source region and the drain region respectively such that a threshold level of the memory is higher than an erase level. Then, a second gate bias, a second source bias and a second drain bias are applied to the gate, the source region and the drain region respectively such that the threshold level of the memory is lower than a predetermined bit level. Next, a third gate bias, a third source bias and a third drain bias are applied to the gate, the source region and the drain region respectively such that the threshold level of the memory approximates to or is equal to the predetermined bit level.

The invention will become apparent from the following detailed description of the preferred but non-limiting embodiments. The following description is made with reference to the accompanying drawings.

DETAILED DESCRIPTION OF THE INVENTION

Figure 1:
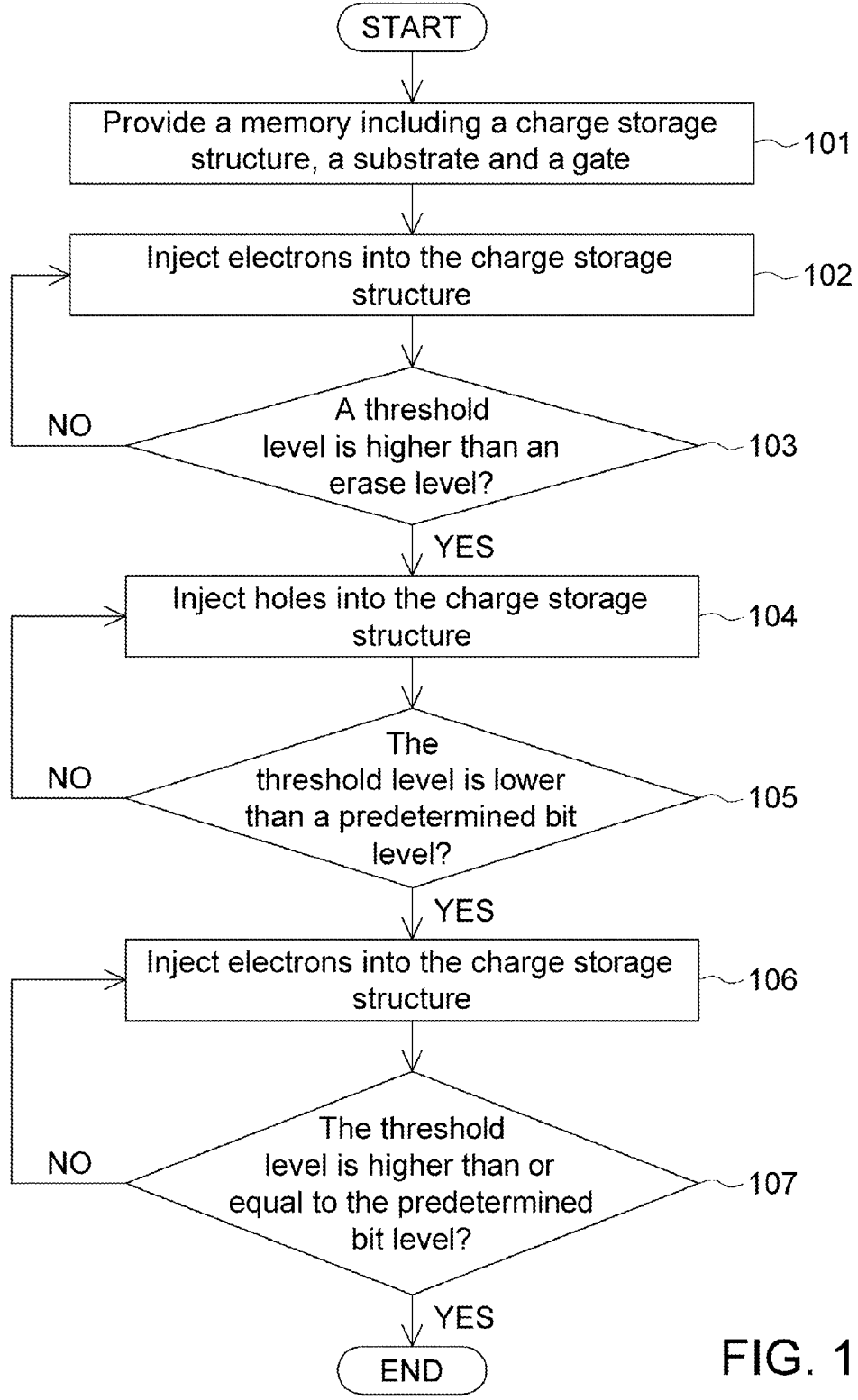
FIG. 1 is a flow chart showing a memory operating method according to a preferred embodiment of the invention.
Figure 2A:
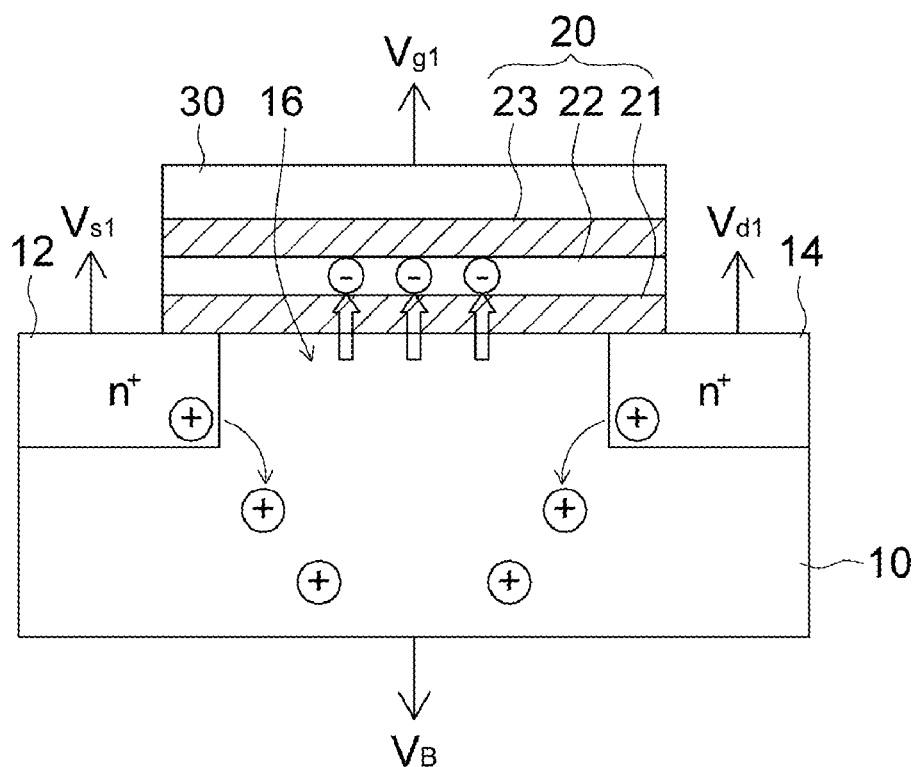
FIG. 2A is a schematic illustration showing an erasing step of the memory operating method according to the preferred embodiment of the invention.
Figure 2B:
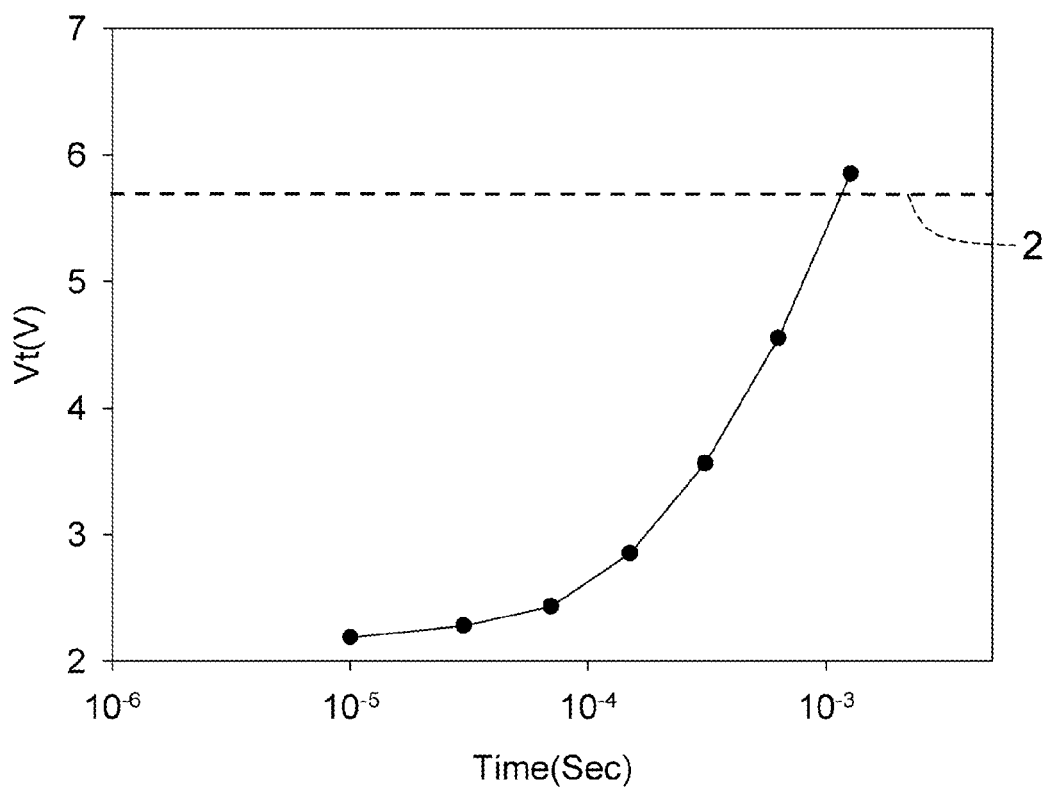
FIG. 2B shows threshold level variations in the erasing step of the memory operating method according to the preferred embodiment of the invention.
Figure 3A:
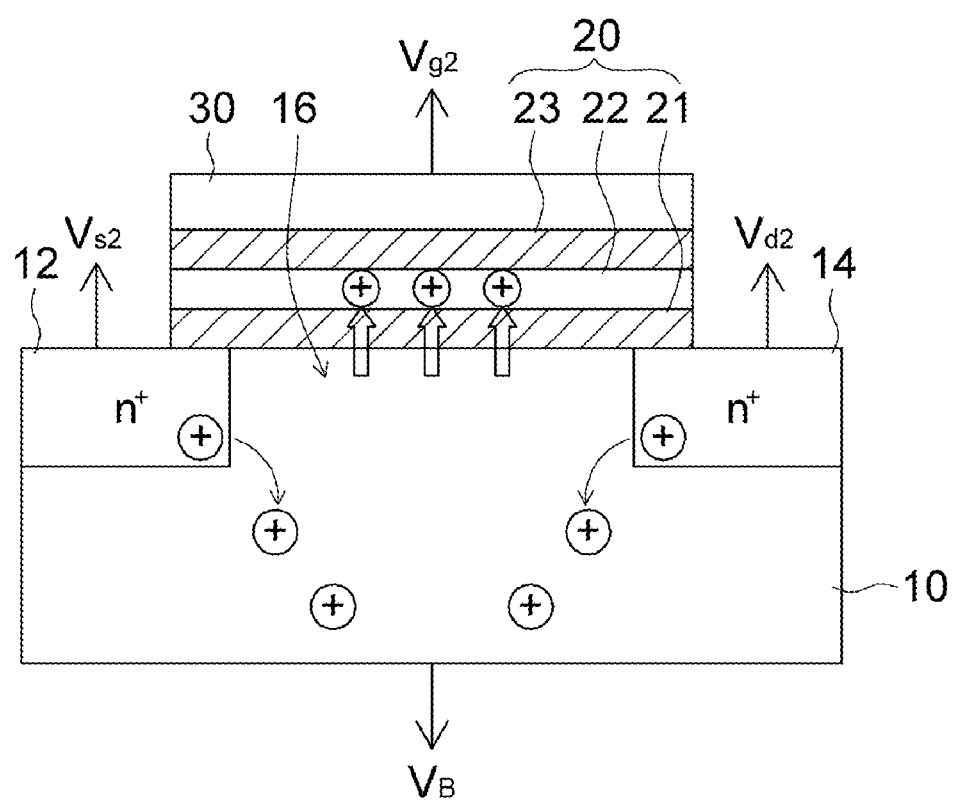
FIG. 3A is a schematic illustration showing a programming step of the memory operating method according to the preferred embodiment of the invention.
Figure 3B:
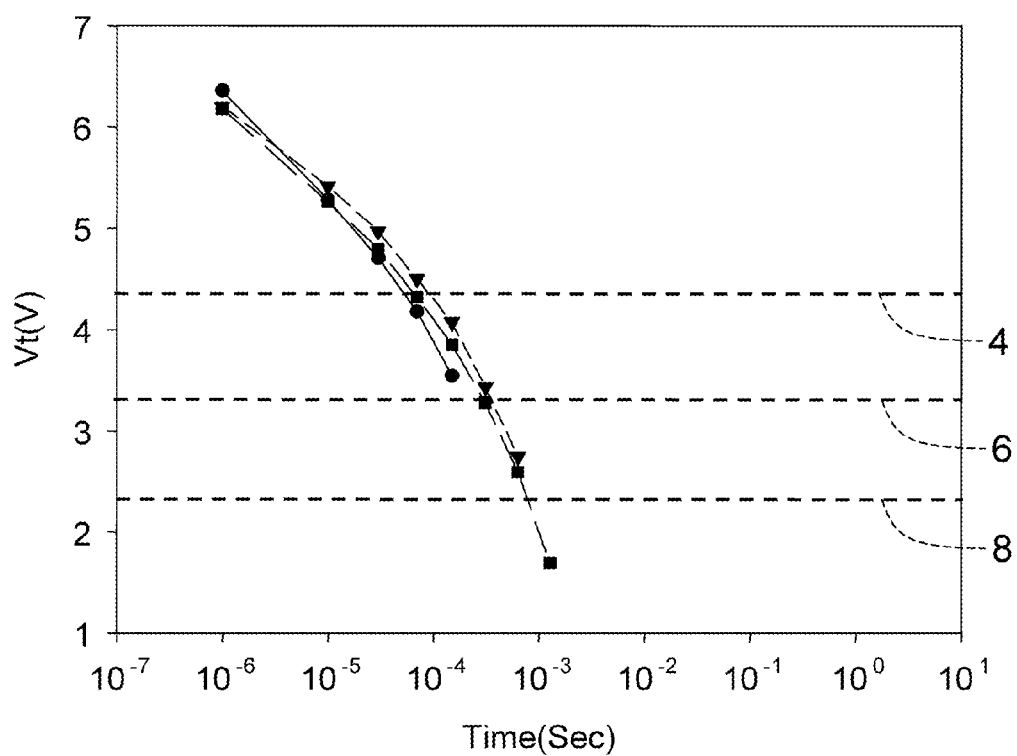
FIG. 3B shows threshold level variations in the programming step of the memory operating method according to the preferred embodiment of the invention.
Figure 4A:
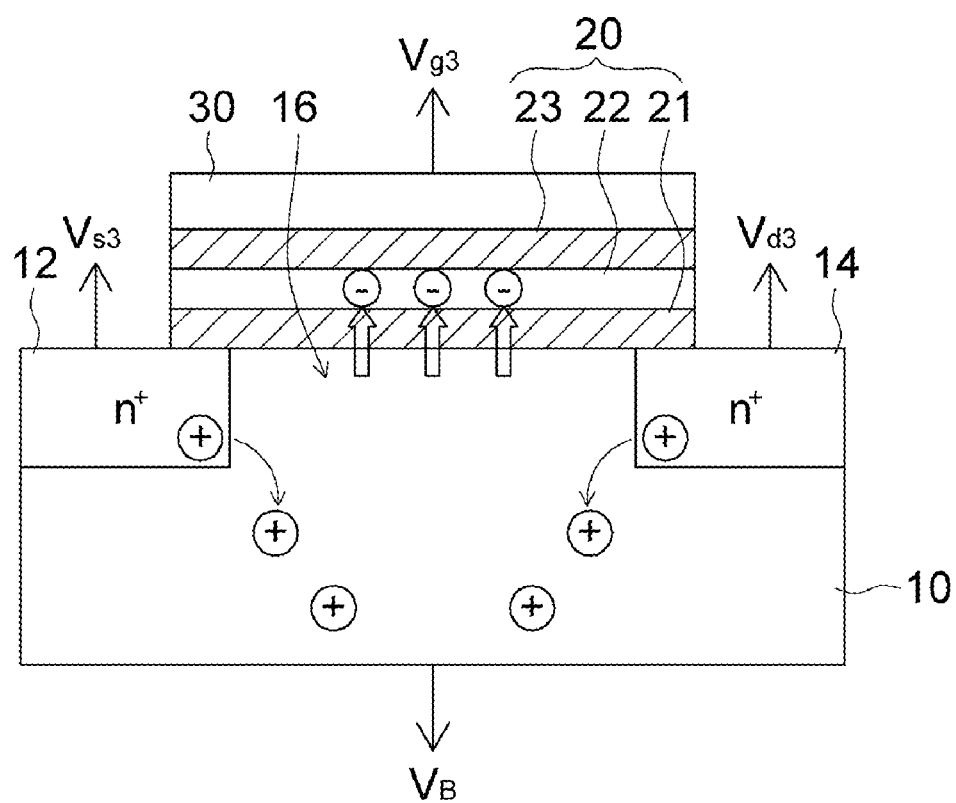
FIG. 4A is a schematic illustration showing a correcting step of the memory operating method according to the preferred embodiment of the invention.
Figure 4B:
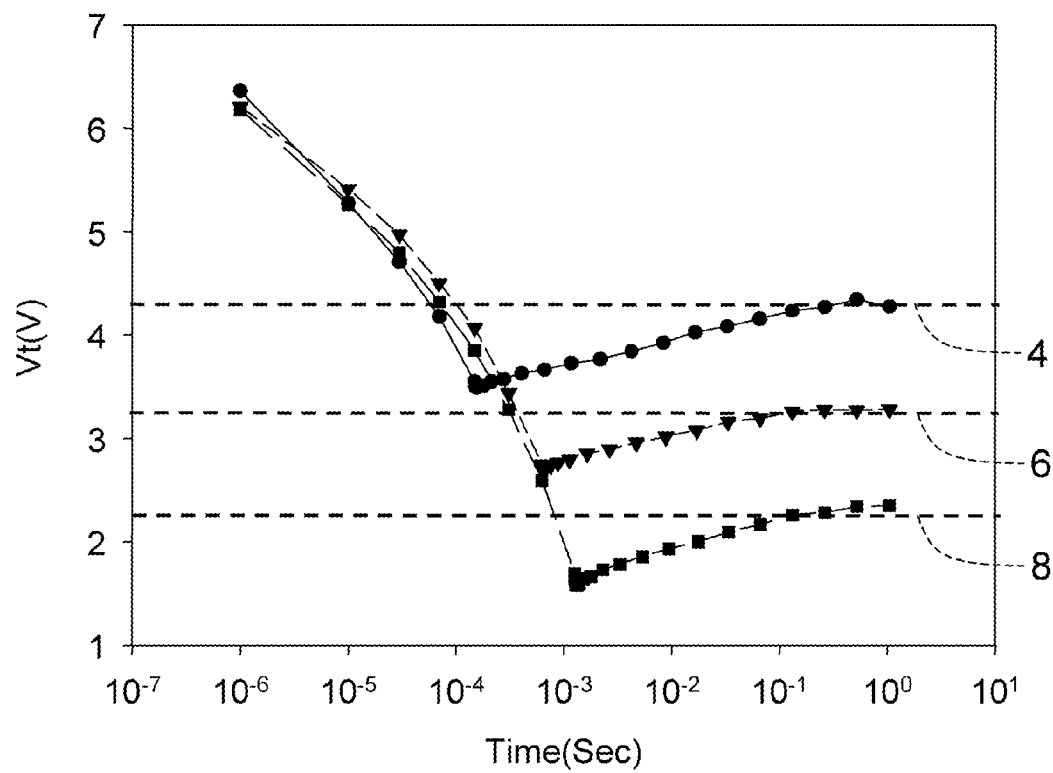
FIG. 4B shows threshold level variations in the correcting step of the memory operating method according to the preferred embodiment of the invention.

FIG. 1 is a flow chart showing a memory operating method according to a preferred embodiment of the invention. FIGS. 2A, 3A and 4A are respectively schematic illustrations showing an erasing step, a programming step and a correcting step of the memory operating method according to the preferred embodiment of the invention. FIGS. 2B, 3B and 4B respectively show threshold level variations in the erasing step, the programming step and the correcting step of the memory operating method according to the preferred embodiment of the invention.

First, as shown in step 101, a memory, such as the memory 50 in FIG. 2A, is provided. The memory 50 may be a memory cell in a memory array. The memory 50 includes a charge storage structure 20, a substrate 10 and a gate 30. The substrate 10 has a channel region 16, a source region 12 and a drain region 14. The channel region 16 is positioned between the source region 12 and the drain region 14, the charge storage structure 20 is disposed on the channel region 16, and the gate 30 is disposed on the charge storage structure 20.

Next, as shown in step 102, first type charges are injected into the charge storage structure 20. In this embodiment, the first type charges are electrons such that a threshold level of the memory 50 is higher than an erase level, such as the erase level 2 in FIG. 2B. As shown in FIG. 2A, a bias $V_{g1}$ is applied to the gate 30 and biases $V_{s1}$ and $V_{d1}$ are respectively applied to the source region 12 and the drain region 14 in step 102 such that the electrons are injected into the charge storage structure 20 from the channel region 16. As shown in FIG. 2B, the threshold level increases as the time of injecting the electrons is lengthened. The object of the step 102 is mainly to set the memory 50 to an erased state to facilitate the subsequent operation.

The step 102 may be performed by a dual side bias (DSB) injection. When the bias $V_{g1}$ applied to the gate 30 ranges from 8V to 12V, for example, and each of the biases $V_{s1}$ and $V_{d1}$ applied to the source region 12 and the drain region 14 ranges from 4V to 6V, for example, holes in the source region 12 and the drain region 14 are accelerated to enter the substrate 10. The holes impact the atoms in the substrate 10 such that the atoms are ionized to generate more electron and hole pairs. The positive bias applied to the gate 30 further draws electrons into the charge storage structure 20.

However, the technology of the invention is not limited thereto. Herein, the step 102 may also be performed by a Fowler-Nordheim (FN) injection. In this case, the bias $V_{g1}$ applied to the gate 30 ranges from 16V to 20V, for example, and the biases $V_{s1}$ and $V_{d1}$ respectively applied to the source region 12 and the drain region 14 are both substantially equal to 0V. Alternatively, the step 102 may also be performed by a channel hot electron (CHE) injection. In this case, the bias $V_{g1}$ applied to the gate 30 ranges from 6V to 10V, and one of the biases $V_{s1}$ and $V_{d1}$ applied to the source region 12 and the drain region 14 ranges from 5V to 7V, for example, and the other of the biases $V_{s1}$ and $V_{d1}$ applied to the source region 12 and the drain region 14 is substantially equal to 0V, for example. Preferably, a bias $V_B$ applied to the substrate 10 of this embodiment is equal to 0V to facilitate the formation of the electric field.

Then, as shown in step 103, it is verified whether the threshold level of the memory 50 is higher than the erase level 2. If the threshold level of the memory 50 is lower than the erase level 2, the procedure goes back to the step 102. If the threshold level of the memory 50 is higher than the erase level 2, the step 104 is performed.

Next, as shown in step 104, second type charges are injected into the charge storage structure 20. In this embodiment, the second type charges are holes such that the threshold level of the memory 50 is lower than a predetermined bit level. As shown in FIG. 3B, the predetermined bit level may be one of a bit level 4, a bit level 6 and a bit level 8, wherein the bit level 8 is lower than the bit level 6 and the bit level 6 is lower than the bit level 4. The object of the step 104 is to adjust the threshold level of the memory 50 to be lower than the predetermined bit level.

As shown in FIG. 3A, a bias $V_{g2}$ is applied to the gate 30 in the step 104, and biases $V_{s2}$ and $V_{d2}$ are respectively applied to the source region 12 and the drain region 14 such that holes are injected into the charge storage structure 20 from the channel region 16. As shown in FIG. 3B, the bias level applied to the gate 30 and the applying time of applying the bias level to the gate 30 are controlled in the step 104 such that the threshold level of the memory 50 is lower than the predetermined bit level, which is one of the bit level 4, the bit level 6 and the bit level 8. If the difference between the predetermined bit level and the erase level 2 is larger, the bias level applied to the gate 30 is higher or the time of applying the bias is longer. Preferably, when the predetermined bit level is the bit level 4, the threshold level of the memory 50 after the step 104 is performed is positioned between the bit level 4 and the bit level 6. When the predetermined bit level is the bit level 6, the threshold level of the memory 50 after the step 104 is performed is positioned between the bit level 6 and the bit level 8. When the predetermined bit level is the bit level 8, the threshold level of the memory 50 after the step 104 is performed is lower than the bit level 8.

Similarly, the step 104 may also be performed using the DSB injection. In this case, the bias $V_{g2}$ applied to the gate 30 ranges from −8V to −12V and each of the biases $V_{s2}$ and $V_{d2}$ applied to the source region 12 and the drain region 14 still ranges from 4V to 6V, for example. Thus, the electric field generated between the gate 30 and the substrate 10 may draw holes into the charge storage structure 20. The step 104 may also be performed using the FN injection. In this case, the bias $V_{g2}$ applied to the gate 30 ranges from −16V to −20V and the biases $V_{s2}$ and $V_{d2}$ applied to the source region 12 and the drain region 14 are substantially equal to 0V, for example. Otherwise, the step 104 may also be performed by a band-to-band hot hole (BBHH) injection. In this case, for example, the bias $V_{g2}$ applied to the gate 30 ranges from −6V to −10V, one of the biases $V_{s2}$ and $V_{d2}$ applied to the source region 12 and the drain region 14 ranges from 5V to 7V, and the other of the biases $V_{s2}$ and $V_{d2}$ applied to the source region 12 and the drain region 14 is substantially equal to 0V.

Then, as shown in step 105, it is verified whether the threshold level of the memory 50 is lower than the predetermined bit level. If the threshold level of the memory 50 is higher than the predetermined bit level, the procedure goes back to step 104. If the threshold level of the memory 50 is lower than the predetermined bit level, the step 106 is performed.

Next, as shown in step 106, the first type charges are injected into the charge storage structure 20. In this embodiment, the first type charge are electrons such that the threshold level of the memory 50 approximates to or is equal to the predetermined bit level. The object of the step 106 is to correct the threshold level of the memory 50 to that approximating to the predetermined bit level. As shown in FIG. 4A, a bias $V_{g3}$ is applied to the gate 30 and biases $V_{s3}$ and $V_{d3}$ are respectively applied to the source region 12 and the drain region 14 in the step 106 such that electrons are injected into the charge storage structure 20 from the channel region 16.

Those skilled in the art may easily understand that the step 106 is performed for fine tuning the threshold level of the memory 50. Therefore, with the same injection method, the bias level applied to the gate 30 in the step 106 is preferably lower than the bias level applied to the gate 30 in the step 104. Thus, the speed of injecting electrons in the step 106 is lower than the speed of injecting holes in the step 104. In other words, the step 104 may perform a quick programming procedure such that the threshold level of the memory 50 is lower than the predetermined bit level, and then the step 106 is performed such that the threshold level of the memory 50 gently converges to the predetermined bit level. Thus, the threshold level of the memory 50 may be precisely programmed to the predetermined bit level.

Similarly, the step 106 may also be performed using the DSB injection. In this case, the bias $V_{g3}$ applied to the gate 30 ranges from −2V to 2V, and each of the biases $V_{s3}$ and $V_{d3}$ applied to the source region 12 and the drain region 14 ranges from 5V to 7V so that the electric field generated between the gate 30 and the substrate 10 may draw electrons into the charge storage structure 20.

Similarly, the step 106 may also be performed by the FN injection. In this case, the bias $V_{g3}$ applied to the gate 30 ranges from 16V to 20V, and the biases $V_{s3}$ and $V_{d3}$ applied to the source region 12 and the drain region 14 are substantially equal to 0V. The step 106 may also be performed by the CHE injection. In this case, the bias $V_{g3}$ applied to the gate 30 ranges from 5V to 10V, one of the biases $V_{s3}$ and $V_{d3}$ applied to the source region 12 and the drain region 14 ranges from 5V to 7V, and the other of the biases $V_{s3}$ and $V_{d3}$ applied to the source region 12 and the drain region 14 is substantially equal to 0V.

The performed step 106 may be discussed according to the following three conditions:

1. When the predetermined bit level is the bit level 4 and the threshold level of the memory 50 after the step 104 is performed is lower than the bit level 4, the bias level applied to the gate 30 in the step 106 is such that the threshold level of the memory 50 approximates to or is equal to the bit level 4. Taking the DSB injection as an example, the bias $V_{g3}$ applied to the gate 30 is equal to 2V, and the biases $V_{s3}$ and $V_{d3}$ applied to the source region 12 and the drain region 14 are equal to 6V, for example.

2. When the predetermined bit level is the bit level 6 and the threshold level of the memory 50 after the step 104 is performed is lower than the bit level 6, the bias level applied to the gate 30 in the step 106 is such that the threshold level of the memory 50 approximates to or is equal to the bit level 6. Taking the DSB injection as an example, the bias $V_{g3}$ applied to the gate 30 is equal to 1V, and the biases $V_{s3}$ and $V_{d3}$ applied to the source region 12 and the drain region 14 are equal to 6V, for example.

3. When the predetermined bit level is the bit level 8 and the threshold level of the memory 50 after the step 104 is performed is lower than the bit level 8, the bias level applied to the gate 30 in the step 106 is such that the threshold level of the memory 50 approximates to or is equal to the bit level 8. Taking the DSB injection as an example, the bias $V_{g3}$ applied to the gate 30 is equal to 0V, and the biases $V_{s3}$ and $V_{d3}$ applied to the source region 12 and the drain region 14 are equal to 6V, for example.

Then, as shown in the step 107, it is verified whether the threshold level of the memory 50 is lower than the predetermined bit level. If the threshold level of the memory 50 is lower than the predetermined bit level, the procedure goes back to the step 106. If the threshold level of the memory 50 is higher than or is equal to the predetermined bit level, the operating method terminates.

If the erase level 2 is set to be that corresponding to the data value 00, the bit level 4 is set to be that corresponding to the data value 01, the bit level 6 is set to be that corresponding to the data value 11 and the bit level 8 is set to be that corresponding to the data value 11, the memory 50 can store two bits of information in one single memory cell. Of course, if more bit levels can be precisely set by programming, more bits of information may be stored.

In this embodiment, the charge storage structure 20 includes a tunneling dielectric layer 21, a charge storage layer 22 and a barrier layer 23. The tunneling dielectric layer 21 is disposed on the channel region 16, the charge storage layer 22 is disposed on the tunneling dielectric layer 21, and the barrier layer 23 is disposed on the charge storage layer 22. When the tunneling dielectric layer 21 is oxide, such as silicon oxide, the charge storage layer 22 is nitride, such as silicon nitride. When the barrier layer is the oxide, such as the silicon oxide, the memory forms a SONOS structure. In addition, the tunneling dielectric layer 21 may also be an ONO layer, and the memory forms a BE-SONOS structure. In addition, the charge storage layer 22 may be replaced with a floating gate, a nanometer crystal layer or an aluminum oxide layer. In addition, the material of the gate 30 in this embodiment is preferably an N-type polysilicon.

The memory operating method according to the embodiment of the invention is to divide the step of writing data into the memory into many stages such that the threshold level of the memory cell of the memory device can precisely converge to the predetermined bit level. Thus, the threshold level of each memory cell can be correctly set so that the data can be precisely written into each memory cell. Consequently, the invention can enhance the precision of the bit determination of the MLC when the memory is being read, enhance the precision of reading data and reduce the possibility of data mis-determination.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory operating method, comprising the steps of:
   (a) providing a memory with a charge storage structure;
   (b) providing a first bias so that the memory has a first threshold voltage;
   (c) providing a second bias so that the memory has a second threshold voltage; and
   (d) providing a third bias so that the memory has a third threshold voltage;
   wherein the first threshold voltage is higher than a first level, the second threshold voltage is lower than a second level, and the third threshold voltage is approximating or equal to the second level, the first level is an erase level, and the second level is a predetermined bit level.

2. The method according to claim 1, wherein in the step (b) a first type charge is injected into the charge storage structure, in the step (c) a second type charge is injected into the charge storage structure, and in the step (d) the first type charge is injected into the charge storage structure.

3. The method according to claim 2, wherein a speed of injecting second type charge in the step (c) is higher than a speed of injecting first type charge in the step (d).

4. The method according to claim 2, wherein the first type charge is electron, and the second type charge is hole.

5. The method according to claim 1, wherein a bias level applied to a gate in the step (d) is lower than a bias level applied to the gate in the step (c).

6. The method according to claim 1, wherein:
   a bias level applied to a gate and an applying time of applying the bias level to the gate are controlled in the step (c) such that the threshold level of the memory is lower than the second level;
   the second level is one of a first bit level, a second bit level and a third bit level, the third bit level is lower than the second bit level, and the second bit level is lower than the first bit level;
   when the second level is the second bit level, the threshold level of the memory after the step (c) is performed is positioned between the third bit level and the second bit level; and
   when the second level is the first bit level, the threshold level of the memory after the step (c) is performed is positioned between the second bit level and the first bit level.

7. The method according to claim 1, wherein in the step (b) a first type charge is injected into the charge storage structure, and injecting first type charge in the step (b) is performed by a dual side bias (DSB) injection, a Fowler-Nordheim (FN) injection or a channel hot electron (CHE) injection.

8. The method according to claim 1, wherein in the step (b), a bias level applied to a gate ranges from 8V to 12V, and each of bias levels applied to a source region and a drain region ranges from 4V to 6V.

9. The method according to claim 1, wherein in the step (b), a bias level applied to a gate ranges from 16V to 20V, and bias levels applied to a source region and a drain region are substantially equal to 0V.

10. The method according to claim 1, wherein in the step (b), a bias level applied to a gate ranges from 6V to 10V, one of bias levels applied to a source region and a drain region ranges from 5V to 7V, and the other of the bias levels applied to the source region and the drain region is substantially equal to 0V.

11. The method according to claim 1, wherein in the step (c) a second type charge is injected into the charge storage structure, and injecting second type charge in the step (c) is performed by a dual side bias (DSB) injection, a Fowler-Nordheim (FN) injection or a band-to-band hot hole (BBHH) injection.

12. The method according to claim 1, wherein in the step (c), a bias level applied to a gate ranges from −8V to −12V, and each of bias levels applied to a source region and a drain region ranges from 4V to 6V.

13. The method according to claim 1, wherein in the step (c), a bias level applied to a gate ranges from −16V to −20V, and bias levels applied to a source region and a drain region are substantially equal to 0V.

14. The method according to claim 1, wherein in the step (c), a bias level applied to a gate ranges from −6V to −10V, one of bias levels applied to a source region and a drain region ranges from 5V to 7V, and the other of the bias levels applied to the source region and the drain region is substantially equal to 0V.

15. The method according to claim 1, wherein in the step (d) a first type charge is injected into the charge storage structure, and injecting first type charge in the step (d) is performed by a dual side bias (DSB) injection, a Fowler-Nordheim (FN) injection or a channel hot electron (CHE) injection.

16. The method according to claim 1, wherein in the step (d), a bias level applied to a gate ranges from −2V to 2V, and each of bias levels applied to a source region and a drain region ranges from 5V to 7V.

17. The method according to claim 1, wherein in the step (d), a bias level applied to a gate ranges from 16V to 20V, and bias levels applied to a source region and a drain region are substantially equal to 0V.

18. The method according to claim 1, wherein the step (d), a bias level applied to a gate ranges from 5V to 10V, one of bias levels applied to a source region and a drain region ranges from 5V to 7V, and the other of the bias levels applied to the source region and the drain region is substantially equal to 0V.

19. The method according to claim 1, after the step (b), further comprising:
verifying whether the threshold level of the memory is higher than the first level.

20. The method according to claim 1, after the step (c), further comprising:
verifying whether the threshold level of the memory is lower than the second level.

21. The method according to claim 1, after the step (d), further comprising:
verifying whether the threshold level of the memory is higher than or equal to the second level.

22. The method according to claim 1, wherein the charge storage structure comprises:
a tunneling dielectric layer disposed on the channel region;
a charge storage layer disposed on the tunneling dielectric layer; and
a barrier layer disposed on the charge storage layer.

23. The method according to claim 22, wherein the tunneling dielectric layer is an ONO layer or an oxide layer.

24. The method according to claim 23, wherein the charge storage layer is a floating gate, a nitride layer, an aluminum oxide layer or a nanometer crystal layer.

25. The method according to claim 23, wherein the barrier layer is an oxide layer.

* * * * *